(12) United States Patent
Fukuda et al.

(10) Patent No.: US 6,911,942 B2
(45) Date of Patent: Jun. 28, 2005

(54) ANTENNA APPARATUS AND COMMUNICATION APPARATUS USING THE SAME

(75) Inventors: Koichi Fukuda, Ube (JP); Hiroshi Ichikawa, Ube (JP); Ryuji Oyama, Ube (JP); Ryo Horie, Tokyo (JP); Shozaburo Kameda, Tokyo (JP); Mitsuhiro Suzuki, Tokyo (JP)

(73) Assignees: Ube Industries, Ltd., Yamaguchi (JP); Yokowo Co., Ltd., Tokyo (JP)

( * ) Notice: Subject to any disclaimer, the term of this patent is extended or adjusted under 35 U.S.C. 154(b) by 0 days.

(21) Appl. No.: 10/468,569

(22) PCT Filed: Feb. 21, 2002

(86) PCT No.: PCT/JP02/01531
§ 371 (c)(1),
(2), (4) Date: Aug. 21, 2003

(87) PCT Pub. No.: WO02/067372
PCT Pub. Date: Aug. 29, 2002

(65) Prior Publication Data
US 2004/0066337 A1 Apr. 8, 2004

(30) Foreign Application Priority Data
Feb. 23, 2001 (JP) .................................. 2001-048294
Aug. 22, 2001 (JP) .................................. 2001-251236

(51) Int. Cl.$^7$ .............................................. H01Q 1/38
(52) U.S. Cl. ............................. 343/700 MS; 343/702; 333/204
(58) Field of Search ...................... 343/700 MS, 873, 343/702, 767; 333/202, 204, 206, 222

(56) References Cited

U.S. PATENT DOCUMENTS 5,952,970 A * 9/1999 Kawahata ............ 343/700 MS
6,166,705 A * 12/2000 Mast et al. ................. 343/853
6,181,223 B1 * 1/2001 Ito .............................. 333/206
6,421,013 B1 * 7/2002 Chung ................. 343/700 MS
6,696,903 B1 * 2/2004 Kawahara et al. .......... 333/134

FOREIGN PATENT DOCUMENTS

| JP | 3-206737   | 9/1991  |
| JP | 6-164096   | 6/1994  |
| JP | 7-42162    | 7/1995  |
| JP | 8-288739   | 11/1996 |
| JP | 11-31905   | 2/1999  |
| JP | 11-168303  | 6/1999  |
| JP | 2000-4116  | 1/2000  |
| JP | 2001-251128| 9/2001  |

* cited by examiner

Primary Examiner—Tho Phan
(74) Attorney, Agent, or Firm—Frommer Lawrence & Haug LLP; Ronald R. Santucci

(57) ABSTRACT

An approximately rectangular plate-shaped radiation member (2) is provided and support portions (4,6) are attached to lower surface end portions adjacent to a pair of parallel shorter sides of the radiation member (2). The support portion (4) is composed of a laminated circuit member including a laminated demultiplexer and a laminated band pass filter of the reception side and the transmission side respectively connected to the laminated demultiplexer. The radiation member (2) has a power supply terminal (2c) and a ground terminal (2d) at the end portion where the support portion (4) is mounted. The power supply terminal (2c) and the ground terminal (2d) are connected to an antenna terminal (4a) and the ground terminal (4b) of the laminated circuit, respectively. The radiation member (2) has a radiation electrode (2a) where a slot (2b) is formed. The shape of the slot is set so that the radiation electrode (2a) causes resonance in a plurality of frequency bands.

17 Claims, 14 Drawing Sheets

ANTENNA APPARATUS AND COMMUNICATION APPARATUS USING THE SAME

This application is a 371 of PCT/JP02/01531 filed on Feb. 21, 2002, published on Aug. 29, 2002 under publication number WO 02/067372 A1 and claims priority benefits of Japanese Patent Application No. 2001-48294 filed Feb. 23, 2001 and Japanese Patent Application No. 2001-251236 filed Aug. 22, 2001.

TECHNICAL FIELD

The present invention relates to a technical field of radio communication, particularly to an antenna apparatus suitable for use in mobile communication and radio local area network (LAN), into which a peripheral circuit portion is incorporated, and a communication apparatus using the antenna apparatus.

BACKGROUND ART

As an antenna for use in radio communication of MHz band to GHz band such as mobile communication, for example, there has heretofore been known an antenna in which a single sheet-shaped conductive member is used to constitute an antenna radiation member as described in JP(A)2000-4116. In this antenna, a ground surface spacer is disposed between the antenna radiation member and a mount substrate. This is because when a substrate constituting a ground is disposed right under the antenna radiation member, a size of space for accumulating resonance energy decreases, and reception sensitivity of the antenna drops. In this manner, an appropriate size of space has to be held between the antenna radiation member and a ground surface.

Usually, a transmission signal is inputted to the antenna radiation member from a transmission circuit via a transmission-side filter, and a reception signal is outputted from the antenna radiation member to a reception circuit via a reception-side filter. Moreover, a transmission/reception branching unit is disposed between the antenna radiation member and the transmission-side and reception-side filters. When the transmission-side and reception-side filters, the branching unit, and the like are disposed on a main body side of a transmitter/receiver (communication apparatus), miniaturization of a transmitter/receiver main body is constrained. Therefore, it has been proposed that these should be included as an antenna peripheral circuit in an antenna apparatus.

For example, it is described in JP(A)8-288739 that in order to miniaturize the apparatus, a dielectric substrate is disposed under the antenna radiation member via the space having a required size, and the antenna peripheral circuit is built in or attached to the dielectric substrate.

There has been a demand for further miniaturization of the antenna apparatus for use in mobile communication and radio LAN. However, in the above-described conventional structure in which the dielectric substrate is disposed under the radiation member, it is necessary to dispose a predetermined distance between the dielectric substrate and the radiation member. Additionally, a thickness of the dielectric substrate is further added, and therefore the antenna apparatus cannot sufficiently be miniaturized. Since it is necessary to dispose the predetermined distance between the dielectric substrate and the radiation member, it is difficult to reduce a distance between the radiation member and the peripheral circuit, and there is therefore a problem that it is difficult to sufficiently reduce a signal loss.

DISCLOSURE OF THE INVENTION

Consequently, an object of the present invention is to provide an antenna apparatus which can further be miniaturized and in which a signal loss can sufficiently be reduced. Another object of the present invention is to provide a communication apparatus in which such an antenna apparatus is used.

According to the present invention, to achieve the above-described objects, there is provided an antenna apparatus comprising: a radiation member having a flat plate shape; and at least one support portion attached to an edge portion of the radiation member on one surface side, wherein the at least one support portion comprises a laminated circuit member including a laminated circuit, the radiation member includes a power supply terminal at the edge portion to which the laminated circuit member is attached, and the power supply terminal is connected to an antenna terminal of the laminated circuit.

In one aspect of the present invention, a surface of the radiation member has an approximately rectangular outer shape, and two support portions are disposed at two edge portions located adjacent to a pair of mutually parallel sides of the surface of the radiation member. In one aspect of the present invention, a surface of the radiation member has an approximately rectangular outer shape, four support portions are disposed at four edge portions located adjacent to four sides of the surface of the radiation member, and ends of the four support portions are connected to one another at positions located adjacent to four corners of the approximately rectangular outer shape to form a frame shape. In one aspect of the present invention, at least two corner portions disposed so as to correspond to at least one end of a direction along a pair of mutually parallel sides of the radiation member are formed in non-concave and non-acute-angle shapes. In one aspect of the present invention, the at least two corner portions of the non-concave and non-acute-angle shapes of the radiation member have a round shape or obliquely linear shape of 135-degrees.

In one aspect of the present invention, for the laminated circuit member, conductive films each having an appropriate pattern are disposed between dielectric sheets disposed adjacent to each other in a plurality of laminated dielectric sheets, the conductive films are appropriately connected by via contact formed in the dielectric sheets to form the laminated circuit, and a shield conductive film is formed extending through at least one of the dielectric sheets in a sheet thickness direction. In one aspect of the present invention, the shield conductive film is positioned between circuit portions disposed adjacent to each other in a plurality of circuit portions constituting the laminated circuit.

In one aspect of the present invention, the laminated circuit includes a laminated branching unit and two laminated dielectric filters connected to the laminated branching unit. In one aspect of the present invention, one of the two laminated dielectric filters is a reception-side band pass filter, and the other of the two laminated dielectric filters is a transmission-side band pass filter.

In one aspect of the present invention, the laminated circuit includes at least one laminated branching unit and a laminated duplexer connected to the laminated branching unit, and the at least one laminated branching unit is connected to two laminated duplexers. In one aspect of the present invention, the laminated circuit includes a plurality of laminated branching units connected to one another in a plurality of stages.

In one aspect of the present invention, the radiation member includes a radiation electrode in which a slot is formed, and a shape of the slot is set so that the radiation electrode causes resonance in a plurality of frequency bands. In one aspect of the present invention, a radiation electrode is formed in an outer surface of the laminated circuit member, and the radiation electrode is connected to the laminated circuit.

Moreover, according to the present invention, there is provided a communication apparatus comprising: the above-described antenna apparatus; and a communication apparatus main body part including an electric circuit electrically connected to the laminated circuit of the antenna apparatus.

In one aspect of the present invention, the communication apparatus main body part includes a mount substrate, and the support portion of the antenna apparatus is attached to the mount substrate. In one aspect of the present invention, the communication apparatus main body part includes a housing in which the antenna apparatus and the mount substrate are contained, and the mount substrate is fixed to the housing. In one aspect of the present invention, the support portion of the antenna apparatus is disposed on the mount substrate in a position distant from one end of the mount substrate.

BEST MODE FOR CARRYING OUT THE INVENTION

Embodiments of the present invention will be described hereinafter with reference to the drawings.

Figure 1:
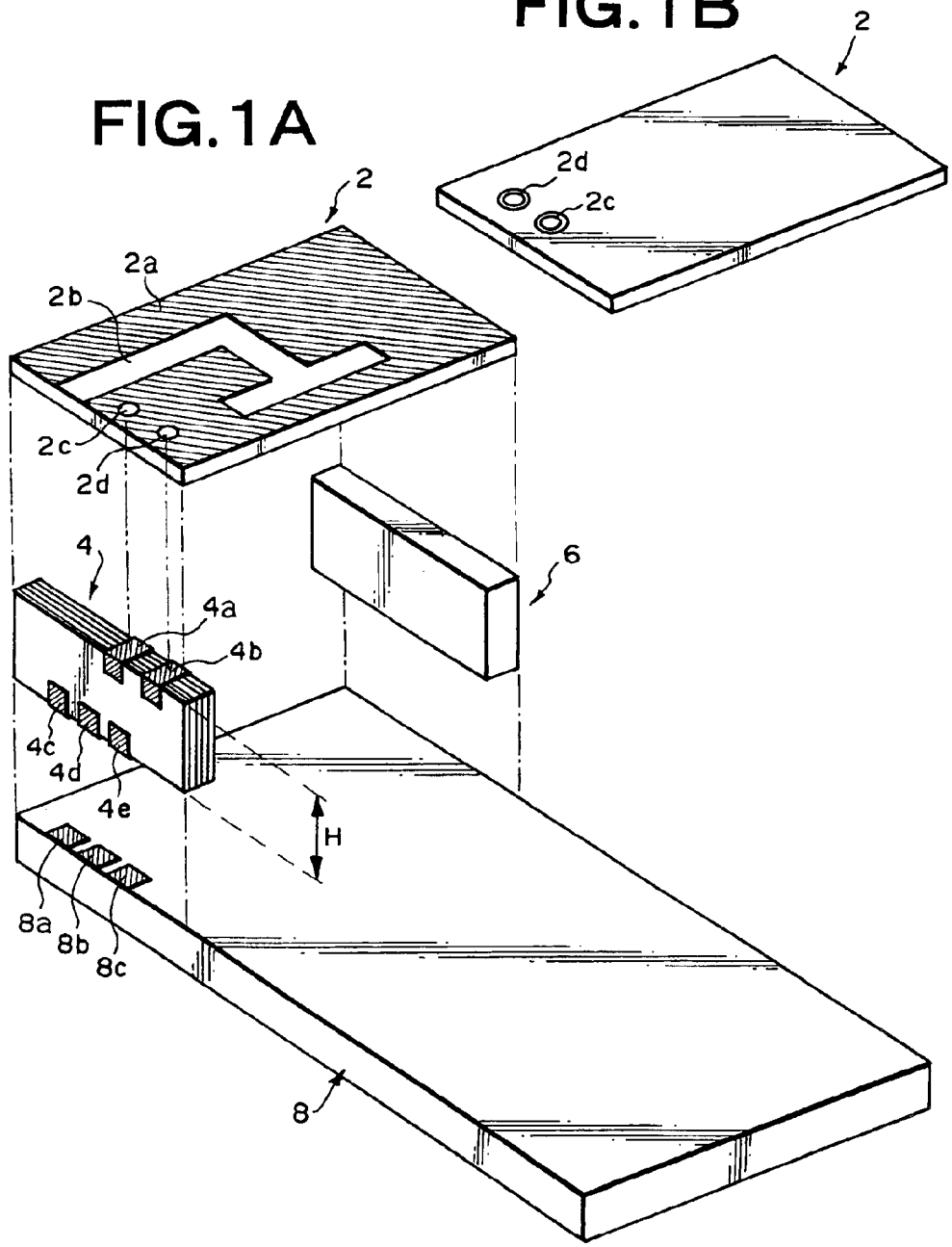
FIG. 1A is a schematic exploded perspective view showing a first embodiment of an antenna apparatus according to the present invention.
FIG. 1B is a perspective view showing a back surface of a radiation member of the antenna apparatus of FIG. 1A.
Figure 2:
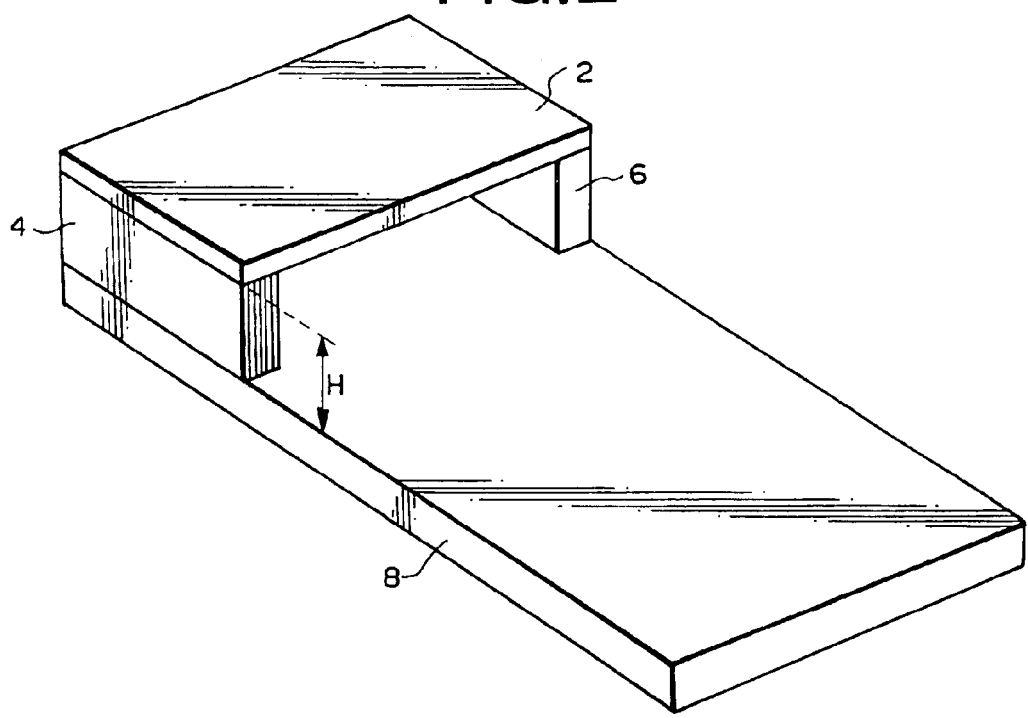
FIG. 2 is a schematic perspective view showing an assembled state of the antenna apparatus of FIG. 1A.

FIG. 1A is a schematic exploded perspective view showing a first embodiment of an antenna apparatus according to the present invention, FIG. 1B is a perspective view showing a back surface of a radiation member of the antenna apparatus, and FIG. 2 is a schematic perspective view showing an assembled state of the antenna apparatus.

In FIGS. 1A and 2, a radiation member 2 is supported by two support portions 4, 6, and the support portions are attached onto a mount board or mount substrate 8.

In the radiation member 2 formed in a flat plate shape, a radiation electrode 2a is formed on one approximately rectangular surface (the upper surface in the drawing) of a substrate formed of dielectric materials such as Teflon (registered trademark) and epoxy resin. The thickness of the substrate of the radiation member 2 is not specifically limited if a desired strength of the radiation member is obtained, and is, for example, 0.1 to 2.0 mm. The dimension of the rectangular shape of the surface of the radiation member 2 is, for example, 20×12 mm to 35×24 mm. A slot 2b is formed in the radiation electrode 2a. Adjacent to a pair of shorter sides of the rectangular shape of the radiation member surface, the support portions 4, 6 are attached to edge portions of the other surface (the lower surface in the drawing) of the radiation member 2 by adhesives. The support portions 4, 6 extend along a pair of shorter sides of the rectangular shape of the surface of the radiation member 2. In the radiation member 2, two via contacts are formed in positions corresponding to the support portion 4, and a power supply terminal 2c and ground terminal 2d connected to the radiation electrode 2a are disposed in these via contacts.

Figure 3:
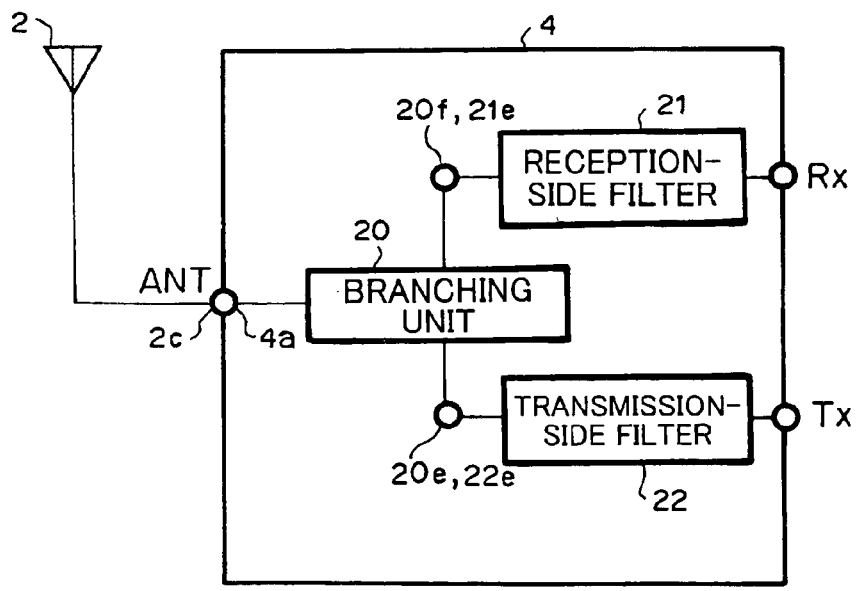
FIG. 3 is a block diagram of a laminated peripheral circuit and radiation member.
Figure 4:
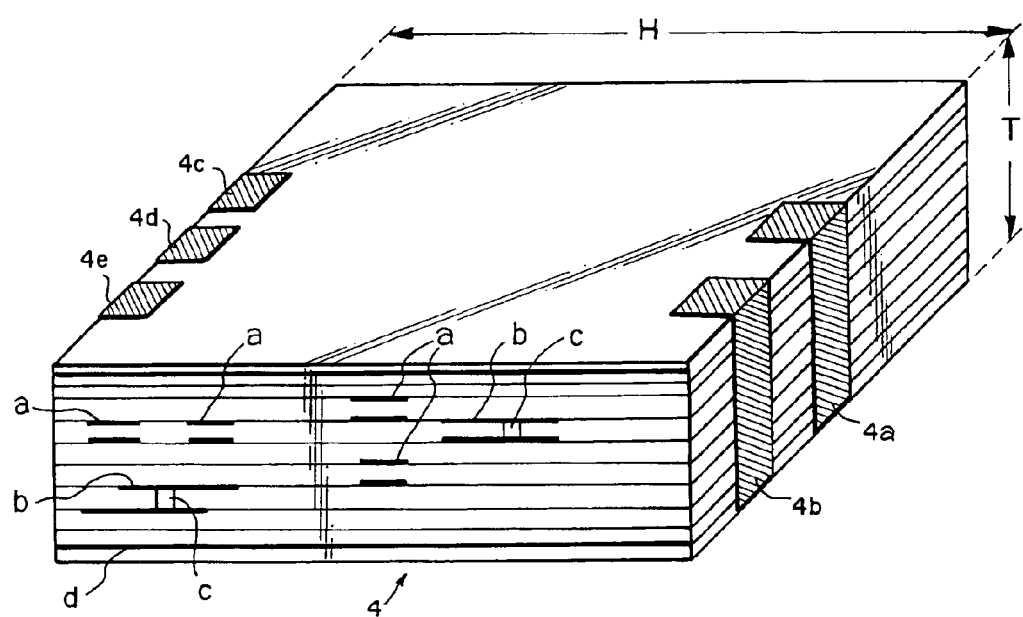
FIG. 4 is a schematic sectional perspective view of the laminated peripheral circuit member.

One support portion 4 is constituted of a laminated peripheral circuit member including a laminated peripheral circuit. The block diagram of the laminated peripheral circuit is shown in FIG. 3 together with the radiation member 2, and FIG. 4 shows a schematic sectional perspective view of the laminated peripheral circuit member (support portion 4). As shown in FIG. 3, the laminated peripheral circuit includes a laminated branching unit (demultiplexer) 20, and two laminated dielectric filters 21, 22 connected to the laminated branching unit 20. The filter 21 is a reception-side band pass filter (BPF), and the filter 22 is a transmission-side band pass filter.

As shown in FIG. 4, for the peripheral circuit member constituting the support portion 4, a plurality of dielectric sheets formed of ceramic or synthetic resin are laminated, a conductive film pattern or ground pattern d having a desired shape is formed between the adjacent dielectric sheets, and desired conductive film patterns of adjacent layers are appropriately connected to each other by a via contact c formed in a desired position of the dielectric sheet. Accordingly, inductors a or capacitors b having desired characteristics are formed, and are appropriately connected to form the branching unit 20 and filters 21, 22.

As shown in FIGS. 1A and 4, in one end surface (the upper end surface in FIG. 1A: the right end surface in FIG. 4) of the support portion 4, an antenna input port (antenna terminal) 4a is formed in a position corresponding to the power supply terminal 2c of the radiation member 2, and a ground port 4b is formed in a position corresponding to the ground terminal 2d of the radiation member 2. The power supply terminal 2c is connected/fixed to the antenna input port 4a by a conductive adhesive or solder, and the ground terminal 2d is connected/fixed to the ground port 4b by the conductive adhesive or solder. The conductive adhesive and solder can be charged into the via contact.

Moreover, a reception signal output terminal portion 4c, transmission signal input terminal portion 4d, and ground terminal portion 4e are formed in the other end surface (the lower end surface in FIG. 1A: the left end surface in FIG. 4) of the support portion 4. A plurality of ground terminal portions 4e may be formed. These are appropriately connected to any of the branching unit 20 and filters 21, 22.

As described above, in the laminated peripheral circuit member (support portion 4), the antenna input port 4a, ground port 4b, reception signal output terminal portion 4c, transmission signal input terminal portion 4d, and ground terminal portion 4e are formed in the end surfaces crossing at right angles to the dielectric sheets constituting the laminated peripheral circuit member. Therefore, when the laminated peripheral circuit member is connected to the radiation member 2 and the mount substrate 8 in the end surfaces, the peripheral circuit can directly electrically be connected to electric circuits of the radiation member 2 and mount substrate 8. In addition, since the reception signal output terminal portion 4c, transmission signal input terminal portion 4d, and ground terminal portion 4e are formed in the end surface on the side opposite to the radiation member 2 side of the support portion 4, the antenna apparatus can directly be mounted on the mount substrate 8.

Figure 5:
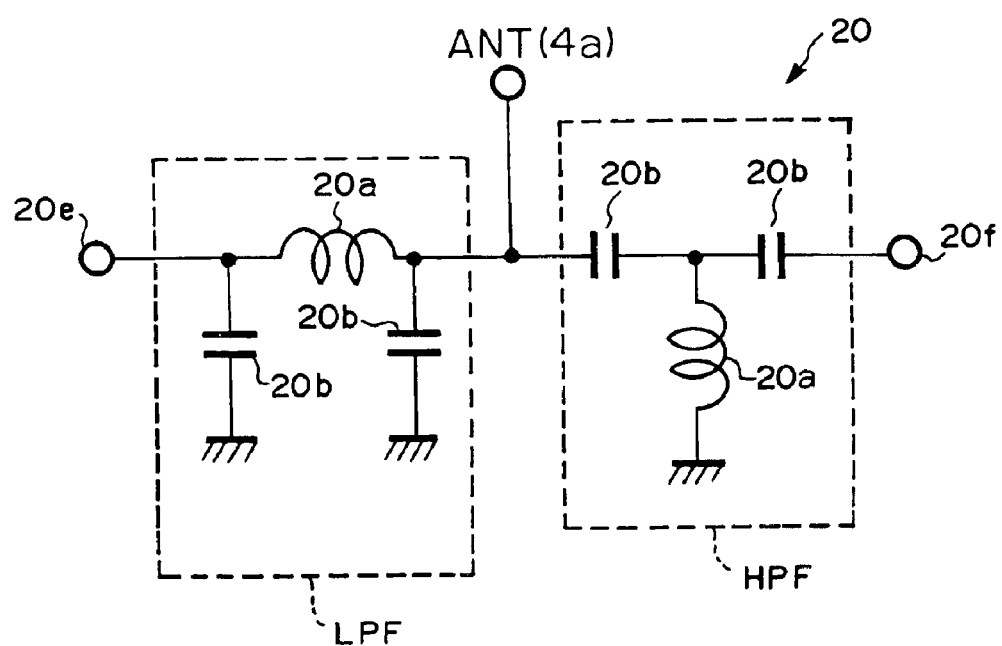
FIG. 5 is an equivalent circuit diagram of a branching unit.
Figure 6:
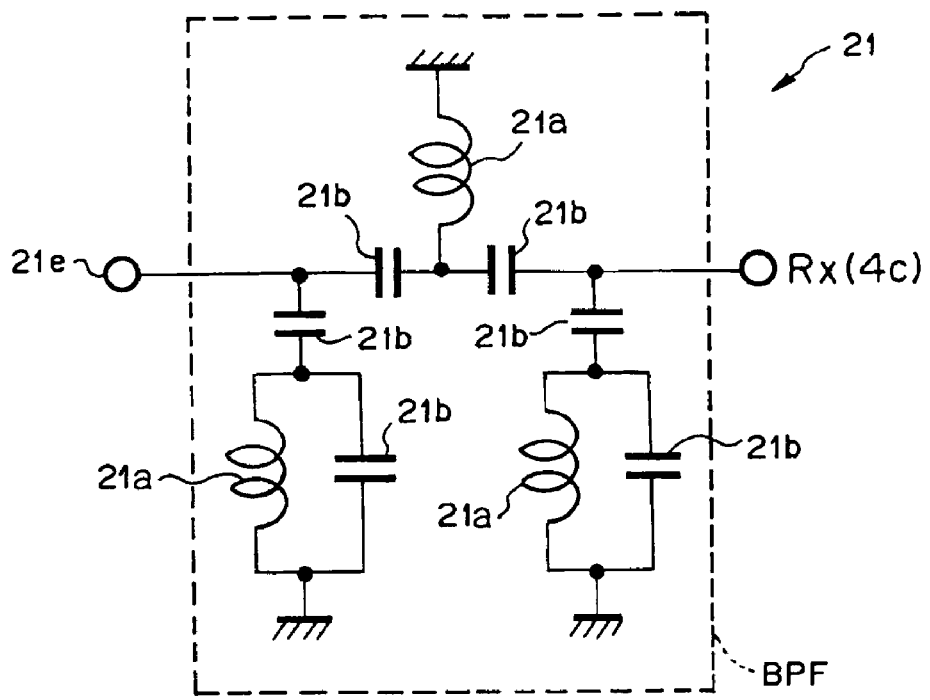
FIG. 6 is an equivalent circuit diagram of a reception-side band pass filter.
Figure 7:
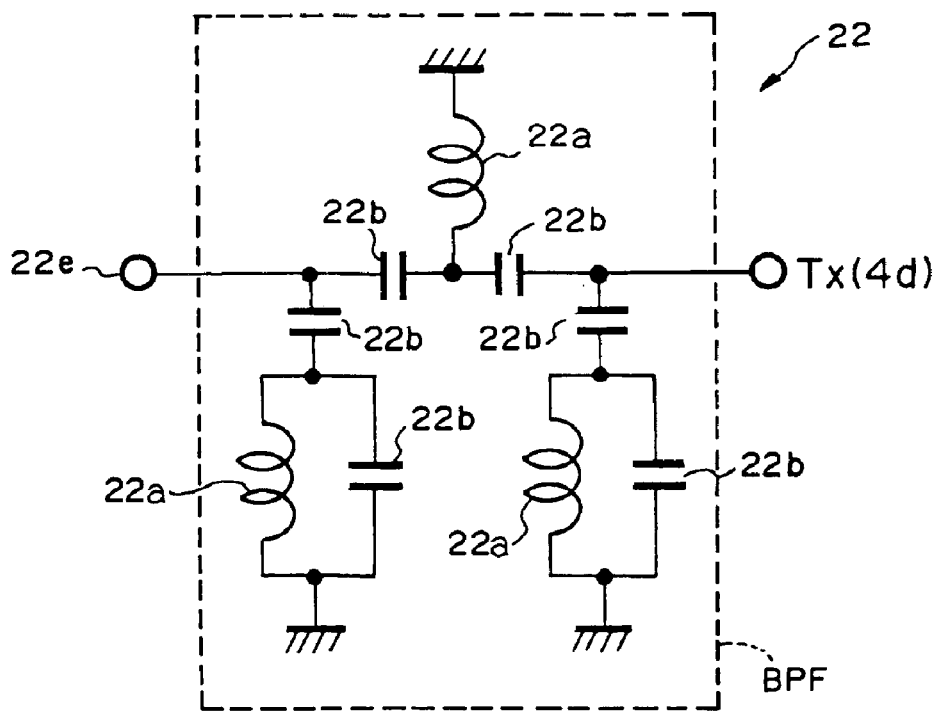
FIG. 7 is an equivalent circuit diagram of a transmission-side band pass filter.

FIG. 5 shows an equivalent circuit of the branching unit 20, FIG. 6 shows an equivalent circuit of the reception-side band pass filter 21, and FIG. 7 shows an equivalent circuit of the transmission-side band pass filter 22. Each of these is constituted using the inductor a (20a, 21a, 22a) and the capacitor b (20b, 21b, 22b). The characteristics of the inductors a and capacitors b are appropriately set so that the branching unit 20, reception-side band pass filter 21, and transmission-side band pass filter 22 having desired characteristics are obtained.

As shown in FIG. 5, the branching unit 20 includes a low pass filter LPF and high pass filter HPF, and includes terminals 20e, 20f and the antenna input port 4a (ANT). As shown in FIG. 6, the reception-side band pass filter 21 includes a terminal 21e and the reception signal output terminal portion 4c (Rx). As shown in FIG. 7, the transmission-side band pass filter 22 includes a terminal 22e and the transmission signal input terminal portion 4d (Tx).

In FIGS. 1A and 2, the material of the other support portion 6 is not specifically limited, but, for example, ceramic or synthetic resin can be used. Alternatively, the antenna radiation member 2 may be extended and bent to form the support portion 6.

The mount substrate 8 may be a usual wiring board, a required wiring is formed on the surface (the upper surface in FIGS. 1A and 2) thereof, and terminal portions 8a, 8b, 8c are formed in positions corresponding to the reception signal output terminal portion 4c, transmission signal input terminal portion 4d, and ground terminal portion 4e of the support portion 4 so as to be connected to the terminal portions. The support portions 4, 6 are fixed to the mount substrate 8, for example, by the adhesive. It is to be noted that an appropriate circuit device can also be attached to the mount substrate 8 especially in a position distant from a position to which the antenna apparatus including the radiation member 2 and support portions 4, 6 is attached, if necessary.

In the present embodiment, the laminated peripheral circuit member constituting the support portion 4 is disposed so that a laminate surface extends vertically to the surface of the radiation member 2. Heights H of the support portions 4, 6 are determined so as to secure a space having an appropriate size under the radiation member 2, and are, for example, 2 to 10 mm. A thickness T of the laminated peripheral circuit member constituting the support portion 4 is, for example, 1 to 4 mm.

Figure 8:
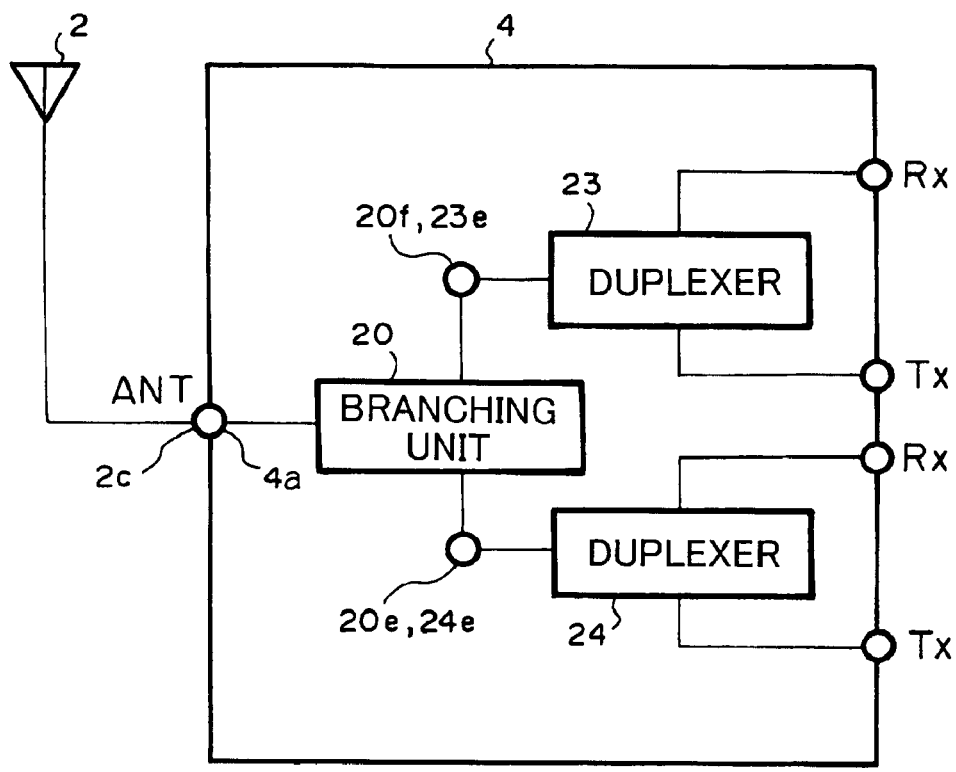
FIG. 8 is a block diagram of a laminated peripheral circuit of a second embodiment of the antenna apparatus according to the present invention.

FIG. 8 is a block diagram of the laminated peripheral circuit of a second embodiment of the antenna apparatus according to the present invention.

In the present embodiment, the peripheral circuit formed in the laminated peripheral circuit member constituting the support portion 4 is different from that of the first embodiment. That is, in the first embodiment, one frequency band is transmitted/received, but in the second embodiment, two frequency bands are transmitted/received. These two frequency bands are, for example, a frequency band of a personal communication system (PCS) in the vicinity of 2 GHz and a frequency band of an advanced mobile phone service (AMPS) in the vicinity of 900 MHz. Accordingly, the antenna apparatus can be used in a PCS/AMPS dual mode mobile phone. It is to be noted that in the present embodiment the shape of the slot 2b of the radiation member 2 is designed so that the radiation electrode 2a causes resonance in the two frequency bands.

Figure 9:
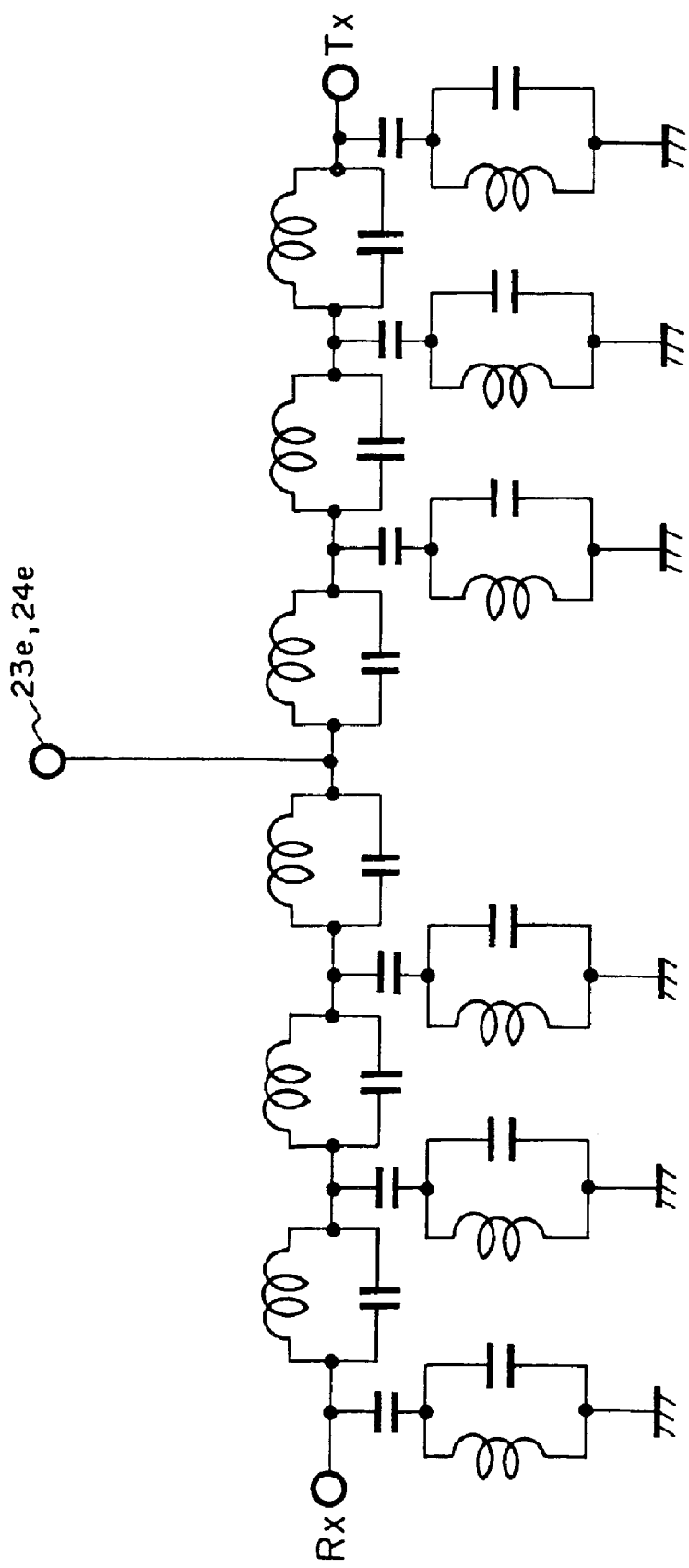
FIG. 9 is an equivalent circuit diagram of a duplexer.

As shown in FIG. 8, the laminated peripheral circuit includes the laminated branching unit 20, and a duplexer 24 for a first frequency band and a duplexer 23 for a second frequency band connected to the branching unit 20, respectively. The equivalent circuit of the duplexers 23, 24 is shown in FIG. 9. Either of these is constituted using the above-described inductor (a) and capacitor (b). The characteristics of the inductor and the capacitor are appropriately set so as to obtain the duplexers 23, 24 which have desired characteristics.

In FIG. 8, the two frequency bands are branched or separated by the branching unit 20. The first frequency band is inputted into one duplexer 24 via a terminal 24e connected to the branching unit terminal 20e, and the second frequency band is inputted into the other duplexer 23 via a terminal 23e connected to a branching unit terminal 20f. The duplexers 23, 24 include a reception signal output terminal Rx and a transmission signal input terminal Tx, respectively. These terminals Rx, Tx are electrically connected to the electric circuit of the mount substrate 8.

Figure 10:
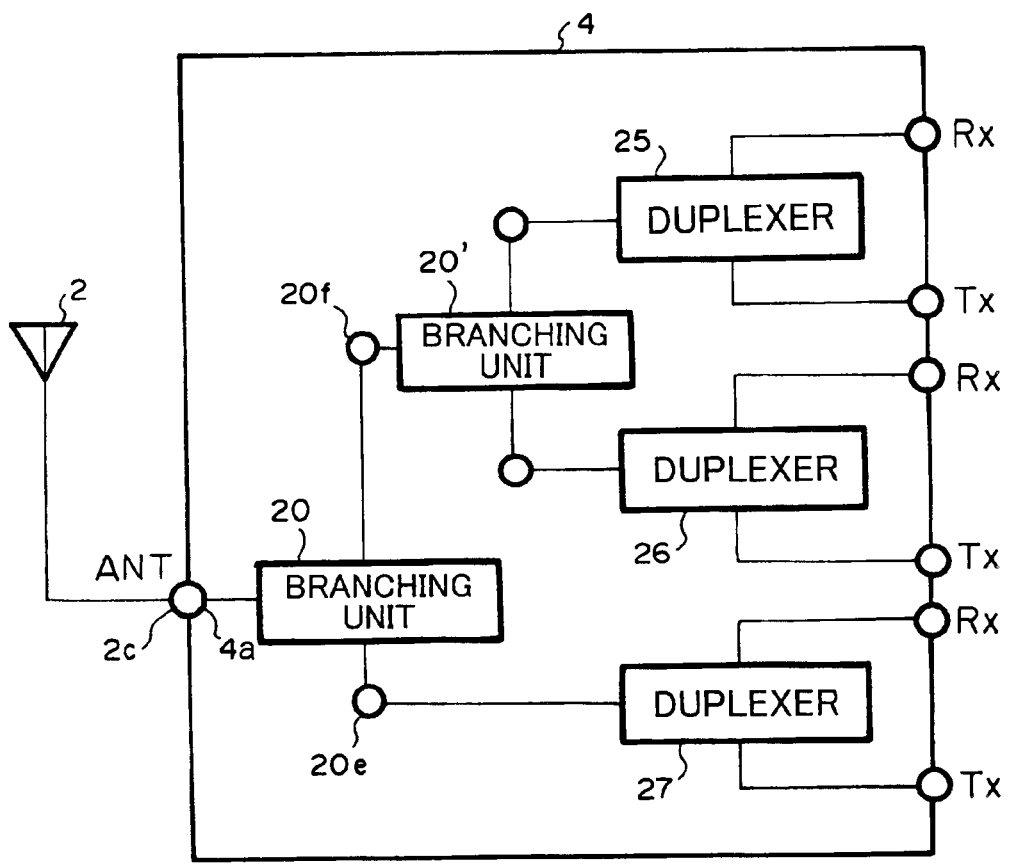
FIG. 10 is a block diagram of a laminated peripheral circuit of a third embodiment of the antenna apparatus according to the present invention.

FIG. 10 is a block diagram of the laminated peripheral circuit of a third embodiment of the antenna apparatus according to the present invention.

The present embodiment is different from the second embodiment in the peripheral circuit formed in the laminated peripheral circuit member constituting the support portion 4. That is, two frequency bands are transmitted/received in the second embodiment, whereas three frequency bands are transmitted/received in the third embodiment. These three frequency bands are, for example, an 800 MHz band for a global system for mobile communication (GSM), a 1.8 GHz band for a digital communication system (DCS), and a 2 GHz band for the PCS. Accordingly, an antenna apparatus is obtained for a small-sized communication apparatus which handles three frequency bands and which has a multiplicity of functions. It is to be noted that in the present embodiment, the shape of the slot 2b of the radiation member 2 is designed so that the radiation electrode 2a causes resonance in the three frequency bands.

As shown in FIG. 10, the laminated peripheral circuit includes the laminated branching unit 20, a duplexer 27 for the first frequency band and a branching unit 20' connected to the laminated branching unit 20, and a duplexer 26 for the second frequency band and a duplexer 25 for a third frequency band connected to the laminated branching unit 20'. The equivalent circuit of the branching unit 20' is similar to that of the branching unit 20, and the equivalent circuits of the duplexers 25, 26, 27 are similar to those of the duplexers 23, 24. Any of these is constituted using the above-described inductor (a) and capacitor (b). The characteristics of the inductor and capacitor are appropriately set so as to obtain the branching units 20, 20' and duplexers 25, 26, 27 which have desired characteristics.

In FIG. 10, the first frequency band and the second and third frequency bands are branched by the branching unit 20, the first frequency band is inputted into the duplexer 27 via a branching unit terminal 20e, and the second and third frequency bands are inputted into the branching unit 20' via a branching unit terminal 20f. The second frequency band and the third frequency band are branched by the branching unit 20', the second frequency band is inputted into the duplexer 26, and the third frequency band is inputted into the duplexer 25. Each of the duplexers 25, 26, 27 includes the reception signal output terminal Rx and transmission signal input terminal Tx. These terminals Rx, Tx are electrically connected to the electric circuit of the mount substrate 8.

As described above, the present embodiment includes the branching units 20, 20' connected to each other in two stages. When four or more frequency bands are transmitted/received, the number of branching units is increased, multi-stage connection of the branching unit is similarly formed, and the required number of duplexers may be used.

In the above-described embodiment, the support portions 4, 6 extend along a pair of shorter sizes of the rectangular shape of the surface of the radiation member 2, but the present invention is not limited to this mode. The support portions may also extend along a pair of longer sides of the rectangular shape of the radiation member surface, and the shape of the radiation member surface may be a square shape. When a plurality of frequency bands are transmitted/received, the two support portions 4, 6 may both be constituted of the laminated circuit member including the laminated circuit. In this case, in each of the support portions 4, 6, the above-described laminated circuit may be formed for the transmission/reception of a single or a plurality of frequency bands which are different from those of the other support portion.

Moreover, when the plurality of frequency bands are transmitted/received, a plurality of radiation electrodes are formed beforehand in the radiation member 2 in accordance with the frequency band, and these radiation electrodes may also individually be connected to the laminated circuit formed in one laminated circuit member.

Furthermore, in the present embodiment, the radiation member surface may have an outer shape other than a rectangular shape, such as pentagonal, hexagonal, and octagonal shapes. Moreover, including a case in which the rectangular shape is used, the support portions may be disposed at all edge portions located adjacent to all the sides of the outer shape of the radiation member surface. Embodiment in which the outer shape of the radiation member surface is rectangular will be described with reference to FIGS. 11 and 12. These diagrams show schematic bottom plan views of the antenna apparatus according to the respective embodiments.

Figure 11:
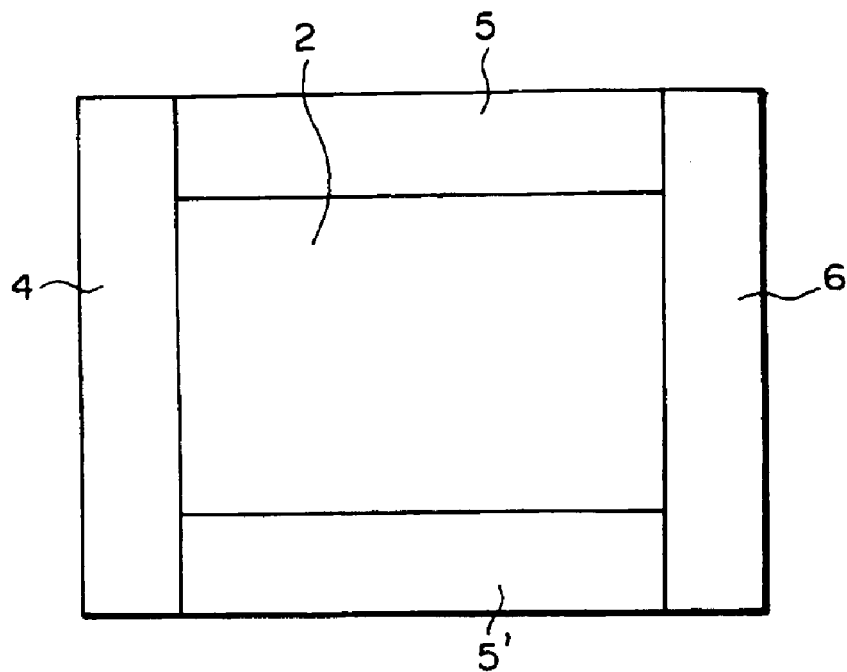
FIG. 11 is a schematic bottom plan view showing an embodiment of the antenna apparatus according to the present invention.

In the embodiment of FIG. 11, the support portions 4, 6 are disposed at two edge portions located adjacent to a first pair of mutually parallel sides of the outer shape of the surface of the radiation member 2 in the same manner as in the above-described embodiments. Additionally, support portions 5, 5' are disposed at two edge portions located adjacent to a second pair of mutually parallel sides of the outer shape of the surface of the radiation member 2 (the sides crossing at right angles to the first pair of sides). Moreover, these support portions 4, 6, 5, 5' form a rectangular frame while the ends of the support portions are connected to each other in positions disposed adjacent to four corners of the substantially rectangular outer shape of the radiation member surface. This connection may be performed by mechanical bond by the adhesive, and the like, or by allowing the portions to abut on each other in attaching the support portions to the radiation member 2. When the support portions are disposed in the frame shape in this manner, the mechanical strength of the antenna apparatus is enhanced. When a plurality of frequency bands are transmitted/received, a plurality of support portions in four support portions 4, 6, 5, 5' may be constituted of the laminated circuit members including the laminated circuits. In this case, a plurality of radiation electrodes are formed beforehand in the radiation member 2 in accordance with at least the number of laminated circuit members, and the plurality of radiation electrodes may individually be connected to the laminated circuits. The above-described laminated circuit for transmitting/receiving a single or a plurality of frequency bands different from those of another laminated circuit member may be formed in each of the laminated circuit members.

Figure 12:
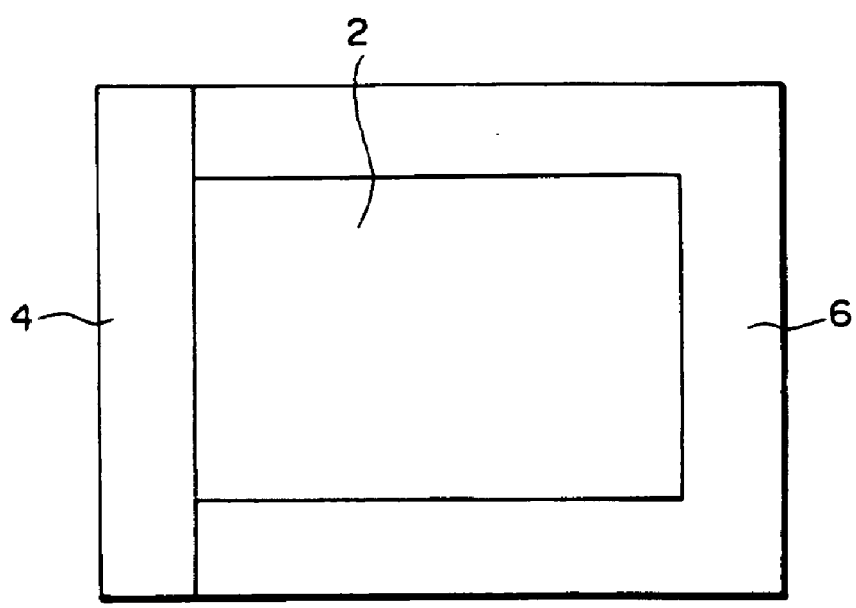
FIG. 12 is a schematic bottom plan view showing an embodiment of the antenna apparatus according to the present invention.

In the embodiment of FIG. 12, the support portion 6 which is not the laminated peripheral circuit member is formed in a U-shape, and accordingly the support portions at the edge portions adjacent to three sides of the outer shape of the surface of the radiation member 2 are integrally formed. The support portion 6 which is not the laminated peripheral circuit member may be similarly formed in an angular shape, and it is accordingly possible to integrally form the support portions at the edge portions adjacent to two sides of the outer shape of the surface of the radiation member.

Figure 13:
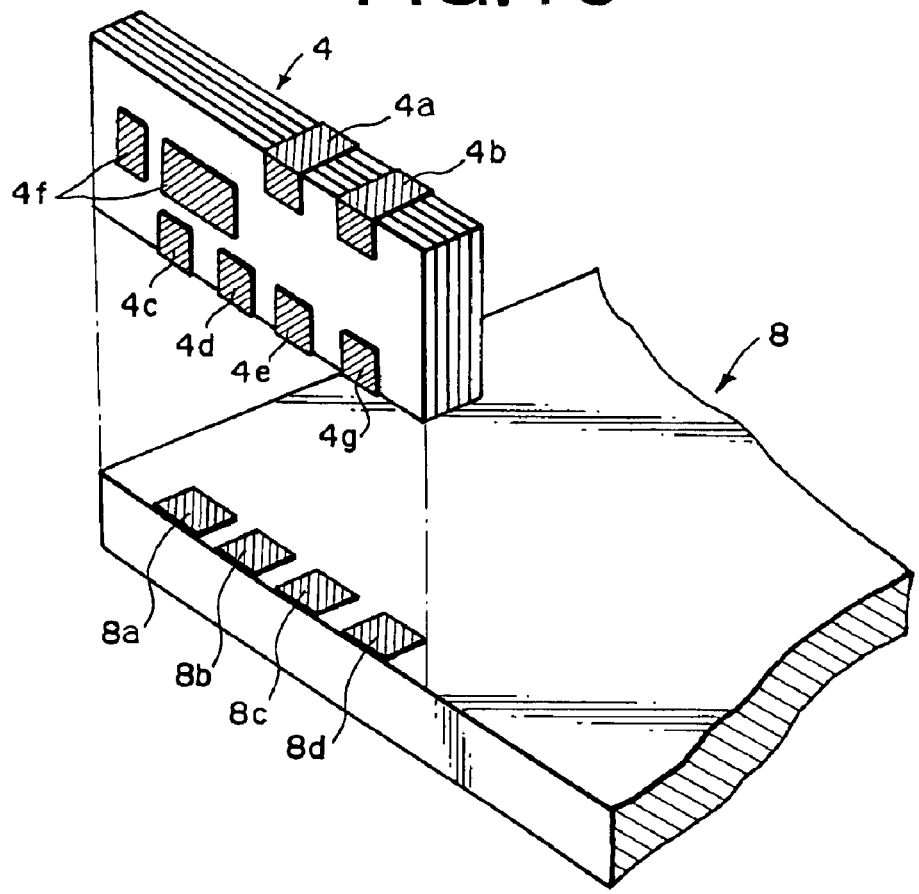
FIG. 13 is a schematic exploded perspective view showing a fourth embodiment of the antenna apparatus according to the present invention.
Figure 14:
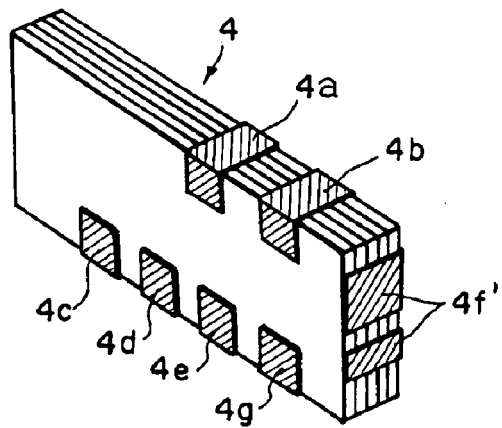
FIG. 14 is a schematic perspective view showing a support portion constituted of a laminated circuit member of a fifth embodiment of the antenna apparatus according to the present invention.

FIGS. 13 and 14 are diagrams showing fourth and fifth embodiments of the antenna apparatus according to the present invention. In these embodiments, the support portion different from that of the first embodiment is used as the support portion 4 constituted of the laminated circuit member.

In the embodiment of FIG. 13, radiation electrodes 4f are formed on the laminate surface of the laminated circuit member, which is the outer surface of the support portion 4. The power supply terminals and ground terminals of the radiation electrodes 4f are appropriately connected to a predetermined circuit portion of the laminated circuit via the via contacts (not shown) formed in the dielectric sheet. An output terminal 4g of the circuit portion is formed in the same manner as other terminals 4c to 4e. It is to be noted that the ground terminal of this circuit portion is shared by the terminal 4e. Moreover, a terminal 8d is formed corresponding to the output terminal 4g in the mount substrate 8.

In the embodiment of FIG. 14, radiation electrodes 4f' are formed on the laminate end surface of the laminated circuit member, which is the outer surface of the support portion 4. The power supply terminal and ground terminal of the radiation electrodes 4f' are appropriately connected to the predetermined circuit portions of the laminated circuit via a conductive film pattern and ground pattern (not shown) formed between the adjacent dielectric sheets. The output terminal 4g of the circuit portion is formed in the same manner as in the embodiment of FIG. 13.

Figure 15:
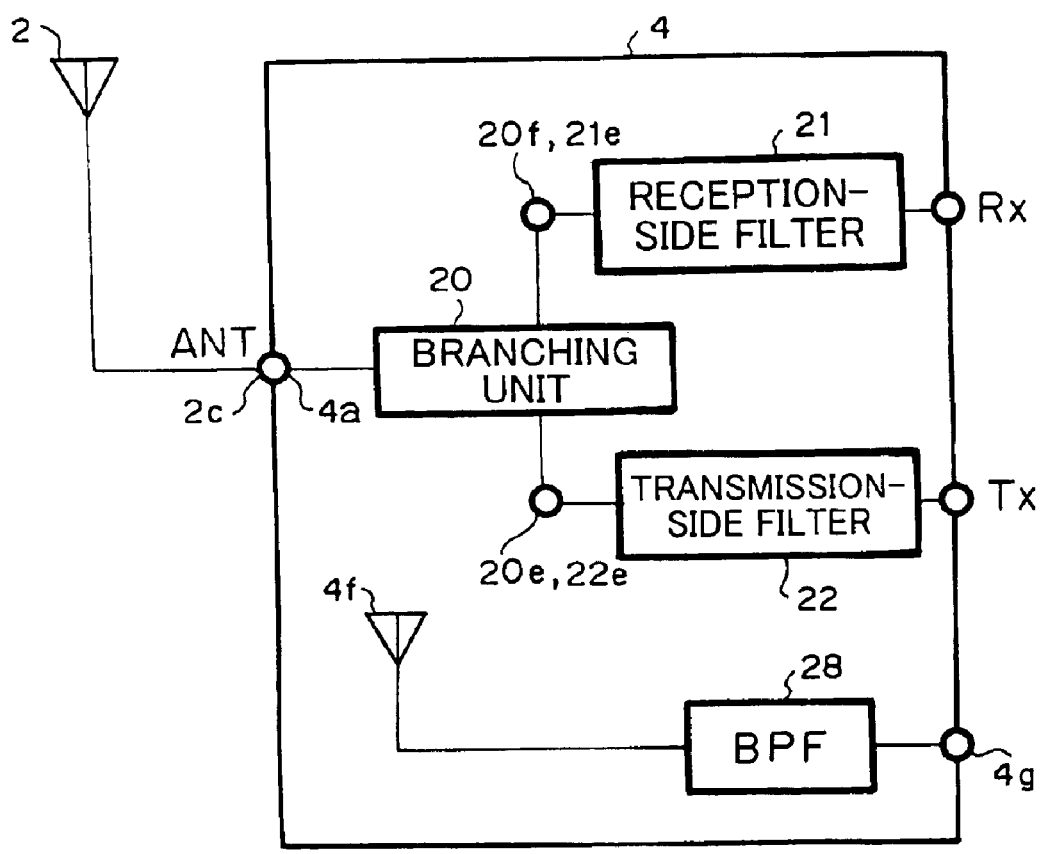
FIG. 15 is a block diagram of a laminated peripheral circuit of the fourth embodiment of the antenna apparatus according to the present invention.

FIG. 15 is a block diagram of the laminated peripheral circuit of the embodiments of FIGS. 13 and 14. In the present embodiment, in addition to the constitution equal to that of the circuit of FIG. 3, a band pass filter 28 connected to the radiation electrode 4f (this also applies to 4f') is disposed for band passage of a 1.5 GHz band for a global positioning system (GPS) or a 2.45 GHz band for Bluetooth (BT). A low pass filter, band elimination filter, high pass filter, and the like can appropriately be disposed in the previous stage of the band pass filter 28.

Two radiation electrodes 4f, 4f' may be formed beforehand in one support portion 4, and it is possible to use one of these for GPS and the other for BT.

According to these embodiments of FIGS. 13 to 15, it is possible to use the system of GPS or BT in PCS/AMPS dual mode mobile phone, and in this case it is possible to sufficiently miniaturize the antenna apparatus.

Figure 16:
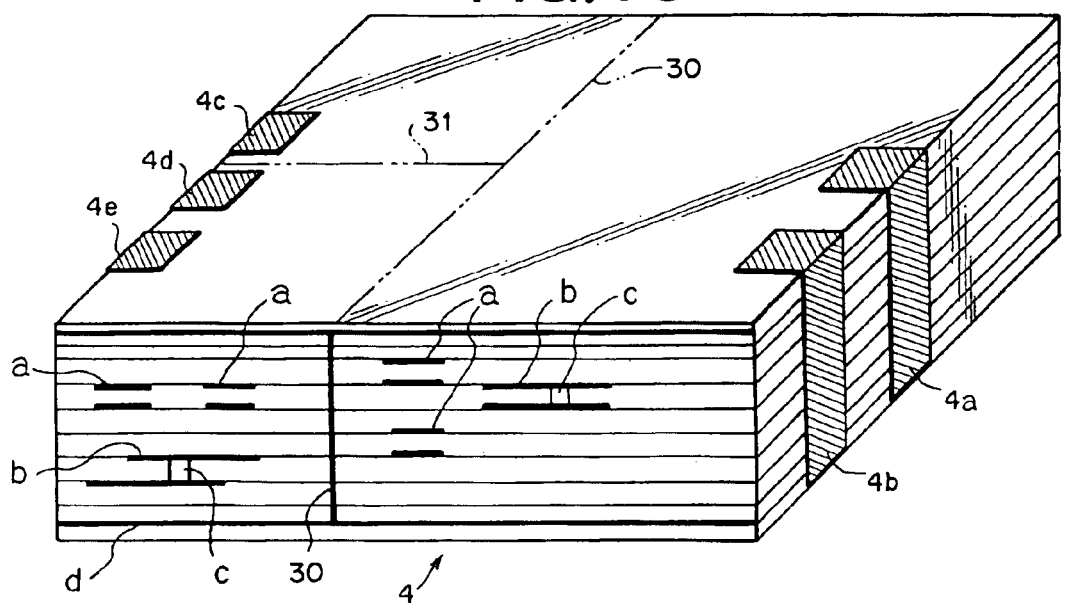
FIG. 16 is a schematic exploded perspective view showing a support portion constituted of a laminated circuit member of an embodiment of the antenna apparatus according to the present invention.
Figure 17:
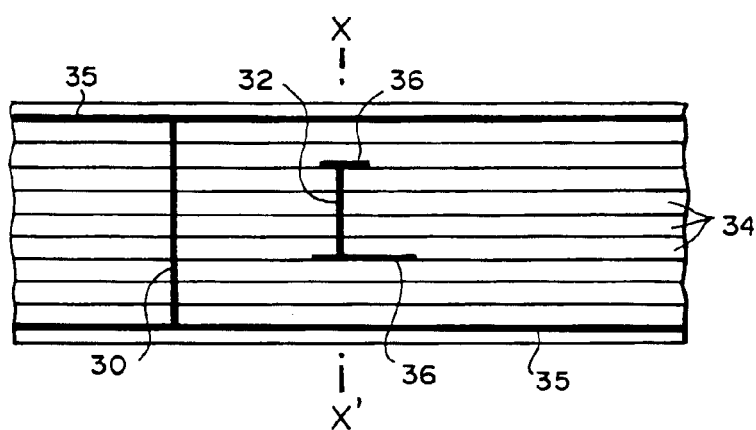
FIG. 17 is a schematic sectional view showing the support portion constituted of the laminated circuit member of the embodiment of the antenna apparatus according to the present invention.
Figure 18:
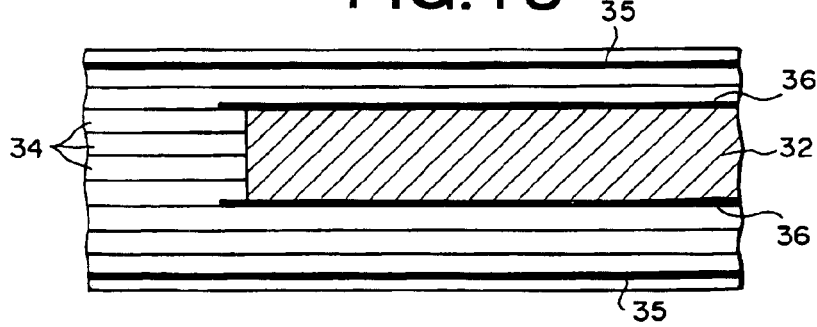
FIG. 18 is an X–X' sectional view of FIG. 17.

FIGS. 16 to 18 are diagrams showing still another embodiment of the antenna apparatus according to the present invention. This embodiment is similar to the first embodiment in that in the structure of the laminated circuit member the conductive films of the appropriate pattern (including the ground pattern formed in almost entire surface) are disposed between the adjacent dielectric sheets in the plurality of laminated dielectric sheets, and these conductive films are appropriately connected to one another by the via contacts formed in the dielectric sheets to form the laminated circuit. However, the embodiment is different from the first embodiment in that shield conductive films (shield walls) 30, 31 are formed so as to extend through the dielectric sheets in the sheet thickness direction as shown in FIG. 16.

FIG. 17 is a schematic partial sectional view showing the shield conductive film, and FIG. 18 is an X–X' sectional view. The shield conductive film 30 is formed in a strip shape extending in a laminate direction (direction of thickness of the dielectric sheets) between ground patterns 35 (d in FIG. 16) disposed in the vicinity of the laminate surfaces of the laminated circuit member on the opposite sides to mutually shield the circuit portions disposed on both sides of the shield conductive film 30. Additionally, the shield conductive film 30 allows a conductive film pattern necessary for electrically connecting these circuit portions to one another to extend in non-contact with the shield conductive film 30. The shield conductive film 31 shown in FIG. 16 is formed in a place different from that of the shield conductive film 30, but includes a structure similar to that of the shield conductive film 30. These shield conductive films 30, 31 mutually shield the branching unit, reception-side filter, and transmission-side filter described with respect to the first embodiment.

Moreover, as shown in FIGS. 17 and 18, strip-shaped via contact may be used in connecting conductive film patterns 36 to each other formed via the appropriate number of dielectric sheets 34 to form a shield conductive film (shield wall) 32. Also in this case, it is possible to mutually shield the circuit devices positioned on both sides of the shield conductive film 32.

In the above-described embodiments, an appropriate combination of the branching unit, reception-side band pass filter, transmission-side band pass filter, and duplexer have been described for use as the peripheral circuit formed in the laminated circuit member. However, in the present invention, instead of or together with such a combination, it is also possible to use the band elimination filter, isolator, and the like formed by the appropriate combination of the inductors a and capacitors b.

Figure 19:
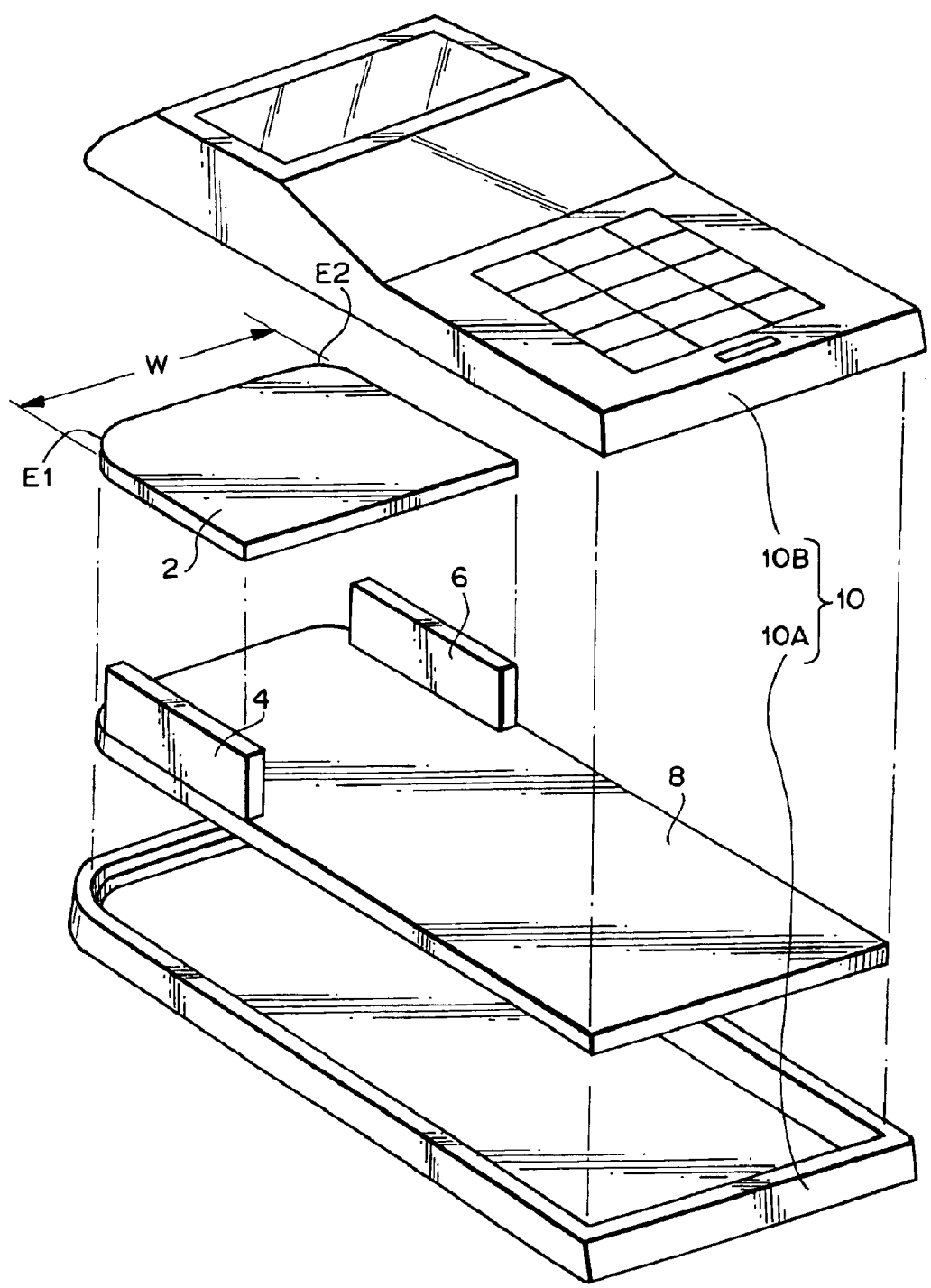
FIG. 19 is a schematic exploded perspective view showing a first embodiment of a communication apparatus including the antenna apparatus of the present invention.

FIG. 19 is a schematic exploded perspective view showing a first embodiment of a communication apparatus including the antenna apparatus of the present invention. The communication apparatus of the present embodiment is a cellular phone (portable terminal for the communication).

The antenna apparatus including the radiation member 2 and the support portions 4, 6 supporting the radiation member is attached onto one surface of the mount substrate 8. The support portion 4 is constituted of the laminated peripheral circuit member. The antenna apparatus of the present embodiment is different from that of the embodiment of FIG. 1 only in the shape of the radiation member 2. That is, in the present embodiment, two corner portions E1, E2 are formed in non-concave and non-acute-angle shape. The corner portions E1, E2 correspond to one end of the radiation member 2 along a pair of sides extending in parallel with each other (i.e., two sides disposed corresponding to a pair of edge portions to which the support portions 4, 6 are attached). The shapes of the corner portions E1, E2 are concretely round shapes such as circular arc shapes. Here, in addition to the circular arc shapes, examples of the round shape include outwardly convex curved shapes such as a part of an ellipse and a part of a secondary curve including a hyperbolic curve. In addition to the round shape, examples of the non-concave and non-acute-angle shape include a shape forming a part of a polygon. As the example, a linear shape (obliquely linear shape of 135-degrees) is illustrated which forms an angle of 135 degrees with respect to both sides of the radiation member positioned with the corner portion interposed therebetween. For the non-concave and non-acute-angle shape, a tangent line does not pass through the inside of the shape in any position.

The corner portion of this shape can be in size of about several percentages to 20% of a width W with respect to the direction of the width W of the radiation member 2. A concrete dimension can be, for example, about 2 to 3 mm with respect to the direction of the width W. An attaching position of the support portion with respect to the radiation member is set so as to avoid the above-described corner portions of the round shape. That is, in the present embodiment, the edge portions of the radiation member on the side of the round shape corner portion further extend from the tip ends of the support portions 4, 6.

With the above-described shapes of the corner portions, the radiation electrode does not easily peel from the corner portion of the radiation member 2, yield in manufacturing is enhanced, deterioration with an elapse of time is inhibited, and reliability is enhanced. Moreover, since the corner portion is not acute, electric field concentration on this portion is prevented. Furthermore, since the area is reduced, a capacitance component with an earth electrode is reduced. Therefore, antenna characteristics, especially frequency characteristics are enhanced.

In the present embodiment, the mount substrate 8 is a main substrate of the cellular phone. Here, the electric circuit electrically connected to the laminated peripheral circuit of the support portion 4 of the antenna apparatus is formed. The electric circuit is electrically connected to a transmitter, receiver, liquid crystal display panel, operation button, and the like (not shown). The mount substrate 8 is contained in a housing 10. The housing 10 is constituted of a housing lower part 10A and a housing upper part 10B, the mount substrate 8 is fixed to the lower part 10A or the upper part 10B, and the lower part 10A and the upper part 10B are fixed to each other so as to cover the mount substrate 8.

Since the corner portion of the radiation member 2 is formed in the round shape, then the space in the housing can effectively be used, the corner portion of the housing 10 can also be rounded, a degree of freedom in a housing design is enhanced, and miniaturizing/lightening of the communication apparatus is achieved.

Furthermore, the antenna apparatus of the present invention is used to constitute the communication apparatus such as cellular phone, and accordingly there is provided a thin and small communication apparatus which maintains a satisfactory reception sensitivity and which has little signal loss.

The number of corner portions formed in the non-concave and non-acute-angle shape is not limited to two, and all the four corner portions may also be formed in the non-concave and non-acute-angle shapes.

Figure 20:
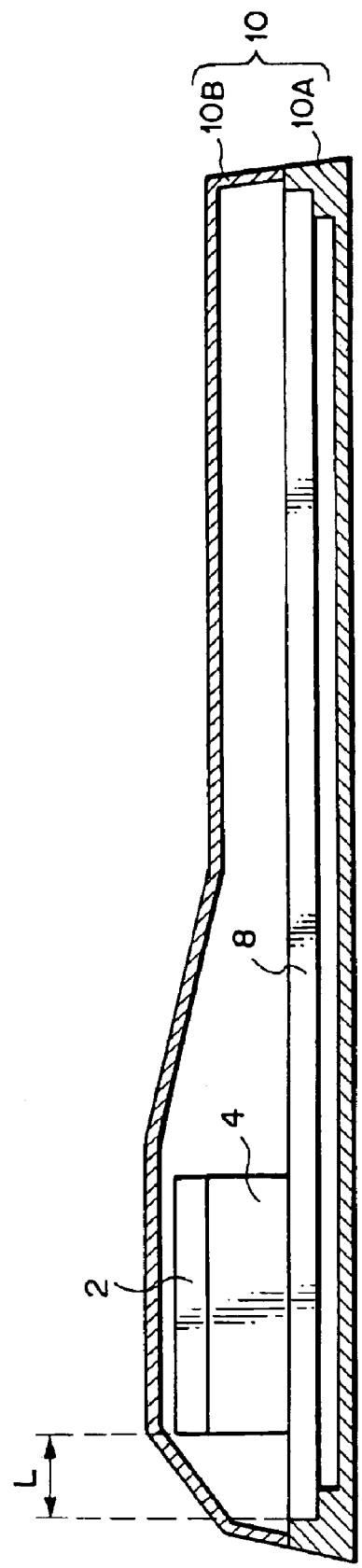
FIG. 20 is a schematic sectional view showing a second embodiment of the communication apparatus including the antenna apparatus of the present invention.

FIG. 20 is a schematic sectional view showing a second embodiment of the communication apparatus including the antenna apparatus of the present invention. As shown, in the present embodiment, with respect to the mount substrate 8, the antenna apparatus including the radiation member 2 and support portion 4 is disposed apart from the end of the mount substrate 8 by a distance L. The antenna apparatus is disposed while avoiding a tip end of the communication apparatus, which is not easily thickened. Accordingly, a required space is secured between the radiation member 2 and mount substrate 8 so that antenna characteristics are enhanced, while the miniaturizing/lightening of the whole apparatus can be achieved.

INDUSTRIAL APPLICABILITY

As described above, according to the present invention, a required space is secured under an antenna radiation member to maintain a satisfactory reception sensitivity, while the antenna apparatus can be thinned and miniaturized. Moreover, a laminated circuit can directly be connected to the antenna radiation member to sufficiently reduce a signal loss by drawing of wire.

What is claimed is:

1. An antenna apparatus comprising:
   a radiation member having a flat plate shape; and
   at least one support portion attached to an edge portion of a surface of the radiation member on one surface side,
   wherein the at least one support portion comprises a laminated circuit member including a laminated circuit, the radiation member includes a power supply terminal at the edge portion of a surface to which the laminated circuit member is attached, and the power supply terminal is connected to an antenna terminal of the laminated circuit.

2. The antenna apparatus according to claim 1,
   wherein the surface of the radiation member has an approximately rectangular outer shape, and two support portions are disposed at two edge portions located adjacent to a pair of mutually parallel sides of the surface of the radiation member.

3. The antenna apparatus according to claim 1,
   wherein the surface of the radiation member has an approximately rectangular outer shape, four support portions are disposed at four edge portion located adjacent to four sides of the surface of the radiation member, and ends of the four support portions are connected to one another at positions located adjacent to four corners of the approximately rectangular outer shape to form a frame shape.

4. The antenna apparatus according to claim 2, wherein at least two corner portions disposed so as to correspond to at least one end of a direction along a pair of mutually parallel sides of the radiation member are formed in non-concave and non-acute-angle shapes.

5. The antenna apparatus according to claim 4, herein the at least two corner portions of the non-concave and non-acute-angle shapes of the radiation member have a round shape or obliquely linear shape of 135-degrees.

6. The antenna apparatus according to claim 1, wherein for the laminated circuit member, conductive films each having an appropriate pattern are disposed between dielectric sheets disposed adjacent to each other in a plurality of laminated dielectric sheets, the conductive films are appropriately connected by via contact formed in the dielectric sheets to form the laminated circuit, and a shield conductive film is formed extending through at least one of the dielectric sheets in a sheet thickness direction.

7. The antenna apparatus according to claim 6, wherein the shield conductive film is positioned between circuit portions disposed adjacent to each other in a plurality of circuit portions constituting the laminated circuit.

8. The antenna apparatus according to claim 1, therein the laminated circuit includes a laminated branching unit and two laminated dielectric filters connected to the laminated branching unit.

9. The antenna apparatus according to claim 8, wherein one of the two laminated dielectric filters is a reception-side band pass filter, and the other of the two laminated dielectric filters is a transmission-side band pass filter.

10. The antenna apparatus according to claim 1, wherein the laminated circuit includes at least one laminated branching unit and a laminated duplexer connected to the laminated branching unit, and the at least one laminated branching unit is connected to two laminated duplexers.

11. The antenna apparatus according to claim 10, wherein the laminated circuit includes a plurality of laminated branching units connected to one another in a plurality of stages.

12. The antenna apparatus according to claim 1, wherein the radiation member includes a radiation electrode in which a slot is formed, and a shape of the slot is set so that the radiation electrode causes resonance in a plurality of frequency bands.

13. The antenna apparatus according to claim 1, wherein a radiation electrode is formed in an outer surface of the laminated circuit member, and the radiation electrode is connected to the laminated circuit.

14. A communication apparatus comprising: the antenna apparatus according to claim 1; and a communication apparatus main body part including an electric circuit electrically connected to the laminated circuit of the antenna apparatus.

15. The communication apparatus according to claim 14, wherein the communication apparatus main body part includes a mount substrate, and the support portion of the antenna apparatus is attached to the mount substrate.

16. The communication apparatus according to claim 15, wherein the communication apparatus main body part includes a housing in which the antenna apparatus and the mount substrate are contained, and the mount substrate is fixed to the housing.

17. The communication apparatus according to claim 15, wherein the support portion of the antenna apparatus is disposed on the mount substrate in a position distant from one end of the mount substrate.

* * * * *